(12) United States Patent
Hanrahan et al.

(10) Patent No.: US 6,657,457 B1
(45) Date of Patent: Dec. 2, 2003

(54) DATA TRANSFER ON RECONFIGURABLE CHIP

(75) Inventors: Shaila Hanrahan, San Jose, CA (US); Peter Shing Fai Lam, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/526,695

(22) Filed: Mar. 15, 2000

(51) Int. Cl.$^7$ .............................................. H03K 19/177
(52) U.S. Cl. .............................. 326/41; 326/38; 326/10
(58) Field of Search .................. 326/37–41, 9, 326/10

(56) References Cited

U.S. PATENT DOCUMENTS

| | | | |
|---|---|---|---|
| 4,758,745 A | | 7/1988 | Elgamal et al. |
| RE34,363 E | | 8/1993 | Freeman |
| 5,260,610 A | | 11/1993 | Pederson et al. |
| 5,260,611 A | | 11/1993 | Cliff et al. |
| 5,349,248 A | * | 9/1994 | Parlour et al. .............. 326/38 |
| 5,455,525 A | * | 10/1995 | Ho et al. ................... 326/41 |
| 5,543,732 A | * | 8/1996 | McClintock et al. ........ 326/41 |
| 5,903,165 A | * | 5/1999 | Jones et al. ................ 326/39 |

* cited by examiner

*Primary Examiner*—Don Le
(74) *Attorney, Agent, or Firm*—Blakely, Sokoloff, Taylor & Zafman LLP

(57) ABSTRACT

A reconfigurable chip having reconfigurable elements uses an interconnection system which reduces the maximum signal rise and fall time. In one embodiment, the maximum rise and fall time is reduced by providing bypass paths. In another embodiment, buffers are used to reduce signal rise and fall times. Connections between each of the elements are provided by either providing a loop path or by providing bidirectional arrangements of the buffers.

40 Claims, 6 Drawing Sheets

DATA TRANSFER ON RECONFIGURABLE CHIP

BACKGROUND OF THE INVENTION

The present invention relates to interconnect systems for use on a reconfigurable chip.

Reconfigurable chips typically have a number of reconfigurable elements, which transfer data through interconnect units to other reconfigurable elements. FIG. 1 shows a prior-art reconfigurable chip arrangement. The reconfigurable chip 20 includes a number of reconfigurable elements 22, 24, 26, 28, 30, 32 and 34 which can be interconnected through interconnect elements 36, 38, 40, 42, 44 and 46. Typically, interconnect elements 36–46 are pass gates that allow signals to be transferred in either direction between the reconfigurable elements. The reconfigurable elements can be, for example, reconfigurable logic blocks, data path units or the like.

The problem with the arrangement shown in FIG. 1 is that if data is to be sent between element 22 and element 34, the data will pass through each of the pass gates 36–46. This can induce an unacceptable resistive/capacitive (RC) signal delay, resulting in an unacceptable signal rise and fall time. The RC delay can impact the total timing and affect the speed of the reconfigurable chip itself.

It is desired to reduce the problem of the RC delay between elements on a reconfigurable chip.

SUMMARY OF THE PRESENT INVENTION

The present invention comprises a reconfigurable chip with a reduced signal rise and fall time between reconfigurable elements.

One embodiment of the present invention comprises a reconfigurable chip with a plurality of reconfigurable elements arranged in a line. The interconnection units are arranged in a first path to allow the plurality of elements to be interconnected to one another. A bypass path includes at least one additional interconnection unit. The bypass path allows the interconnection of at least some of the elements while bypassing a number of interconnection units in the first path so as to reduce the signal delay between some of the elements. The use of the bypass path reduces the maximum signal delay and thus can improve the interconnection speeds for the reconfigurable chip.

A number of other embodiments of the present invention use buffer elements. The buffer elements reduce rise and fall times by driving the parasitic capacitance in the path. One disadvantage of using the buffers is that some manner of arranging a connection between all the reconfigurable elements must be provided.

One embodiment of the present invention is a reconfigurable chip comprising a plurality of elements arranged in a line, and an interconnection path arranged in a loop to allow the plurality of elements to be interconnected to one another. The interconnection path includes buffer elements to reduce the signal delay and isolating elements to electrically isolate different sections of the loop.

Another embodiment of the present invention comprises a reconfigurable chip comprising a plurality of elements arranged in a line, and interconnection paths to allow the plurality of elements to be interconnected to one another. The interconnection paths can include buffer elements to reduce signal rise and fall times and isolating elements to electrically isolate sections of the path. The buffer and isolating elements are arranged such that signals can go in either directions along path sections.

DETAILED DESCRIPTION OF THE PREFERRED EMBODIMENT

Figure 1:
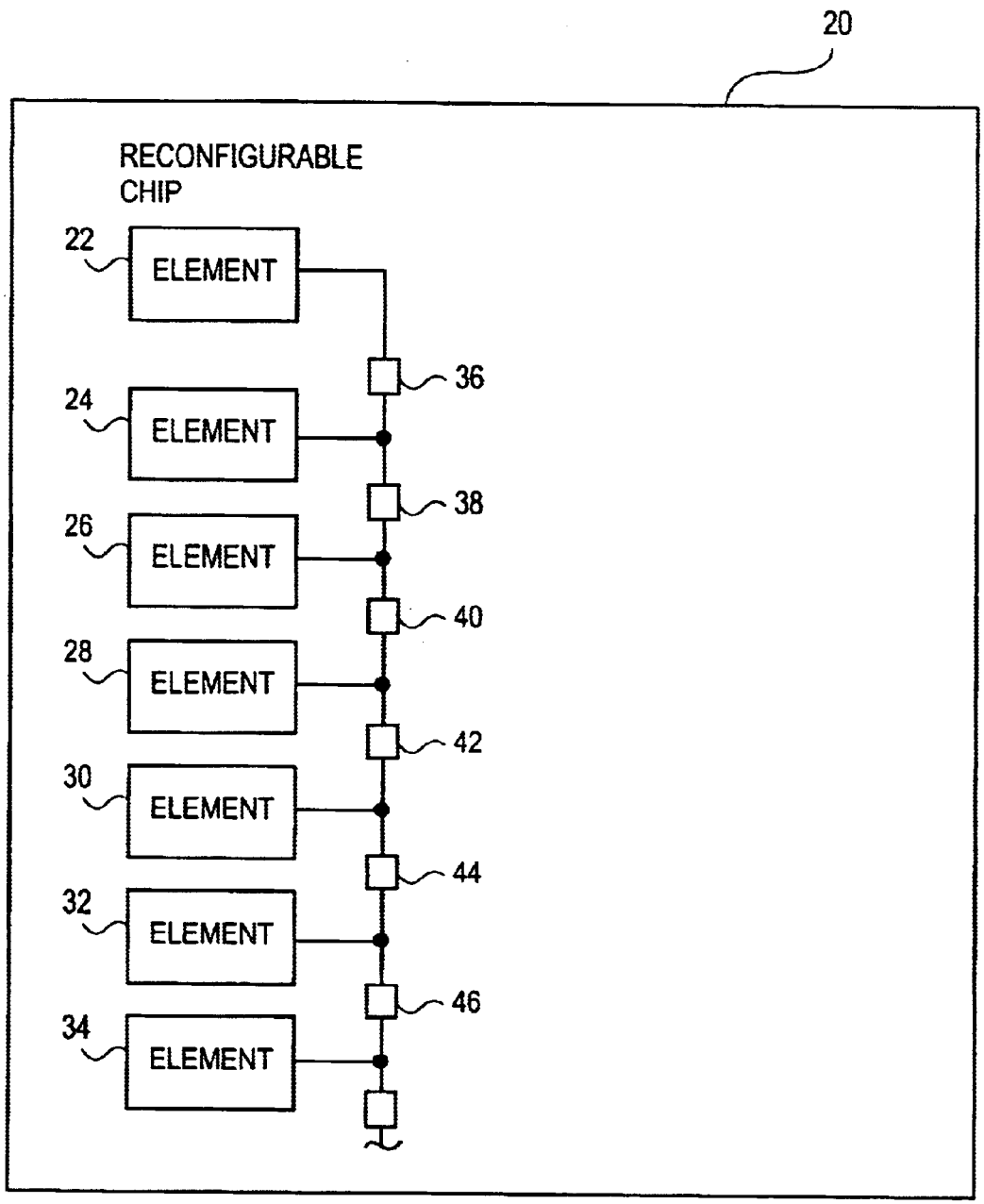
FIG. 1 illustrates a prior-art reconfigurable chip with reconfigurable elements interconnected using pass gates.
Figure 2:
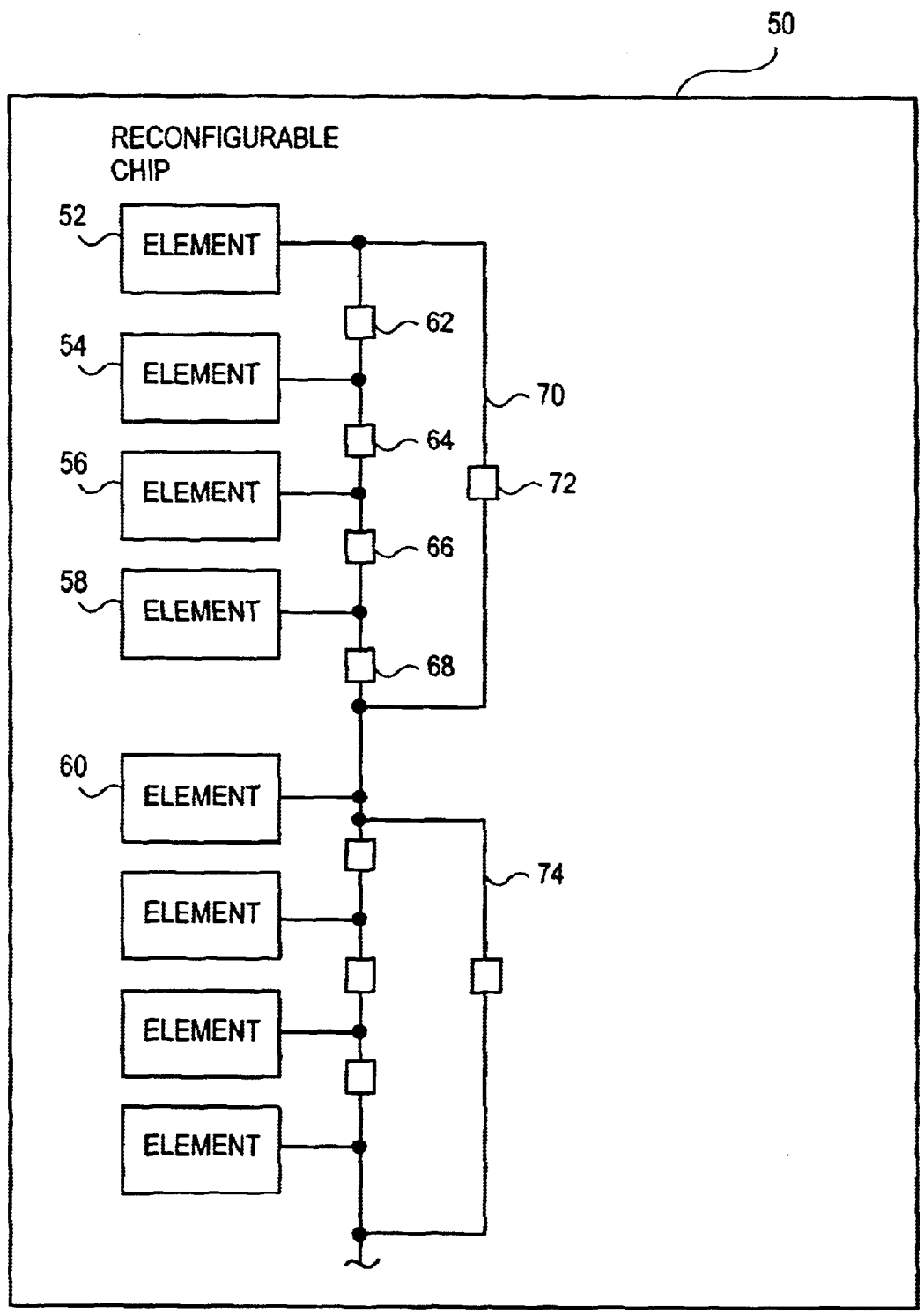
FIG. 2 is a diagram illustrating a reconfigurable chip with elements interconnected using the interconnection system of one embodiment of the present invention.

FIG. 2 illustrates a reconfigurable chip 50 using the interconnect system of one embodiment of the present invention. Elements 52, 54, 56, 58 and 60 are connected using pass gates 62, 64, 66 and 68 along a first interconnection path. The interconnection system includes a second bypass path 70, including a pass transistor 72 which allows element 52 to be connected to element 60 through only the interconnection element 72. By going through only a single pass gate 72, rather than four pass gates 62–68, the signal rise and fall time is reduced. As shown in FIG. 2, a number of such bypass paths, such as bypass path 74, can be used for a single line of reconfigurable elements. Use of the bypass paths in different combinations allows for the largest interconnect delay to be reduced.

Note that the elements shown in FIG. 2 can require the concurrent transfer of more than a single bit. In this case, the interconnection path and bypass path will be buses, allowing the simultaneous transfer of more than one bit of data. In this case multiple pass gates will be used for each bus.

Figure 3:
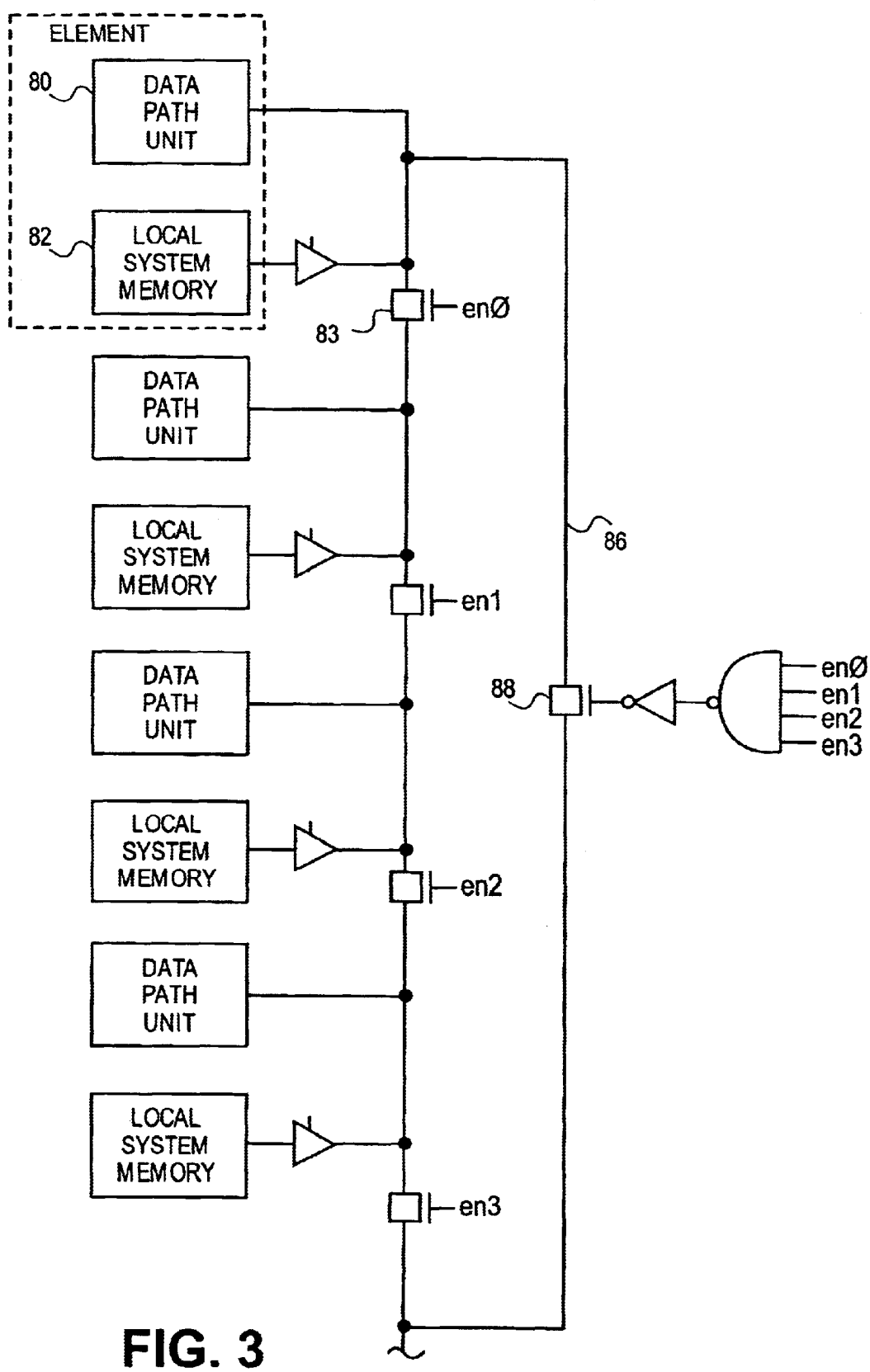
FIG. 3 is a diagram that illustrates one embodiment of the system described with respect to FIG. 2.

FIG. 3 illustrates details of one embodiment of the system of FIG. 2. The reconfigurable elements in this embodiment comprise the combination of a data path unit and a local system memory. The interconnection of the elements is done by pass gates controlled by enable lines. The bypass path 86 uses pass transistor 88. When all of the enable lines (enable 0, enable 1, enable 2 and enable 3) go high, the interconnect unit 88 will turn on, allowing the bypass path connection for a quicker interconnection. The advantage of the arrangement of FIG. 3 is that the control logic for creating the enable line signals does not need to control the interconnect unit 88.

Figure 4:
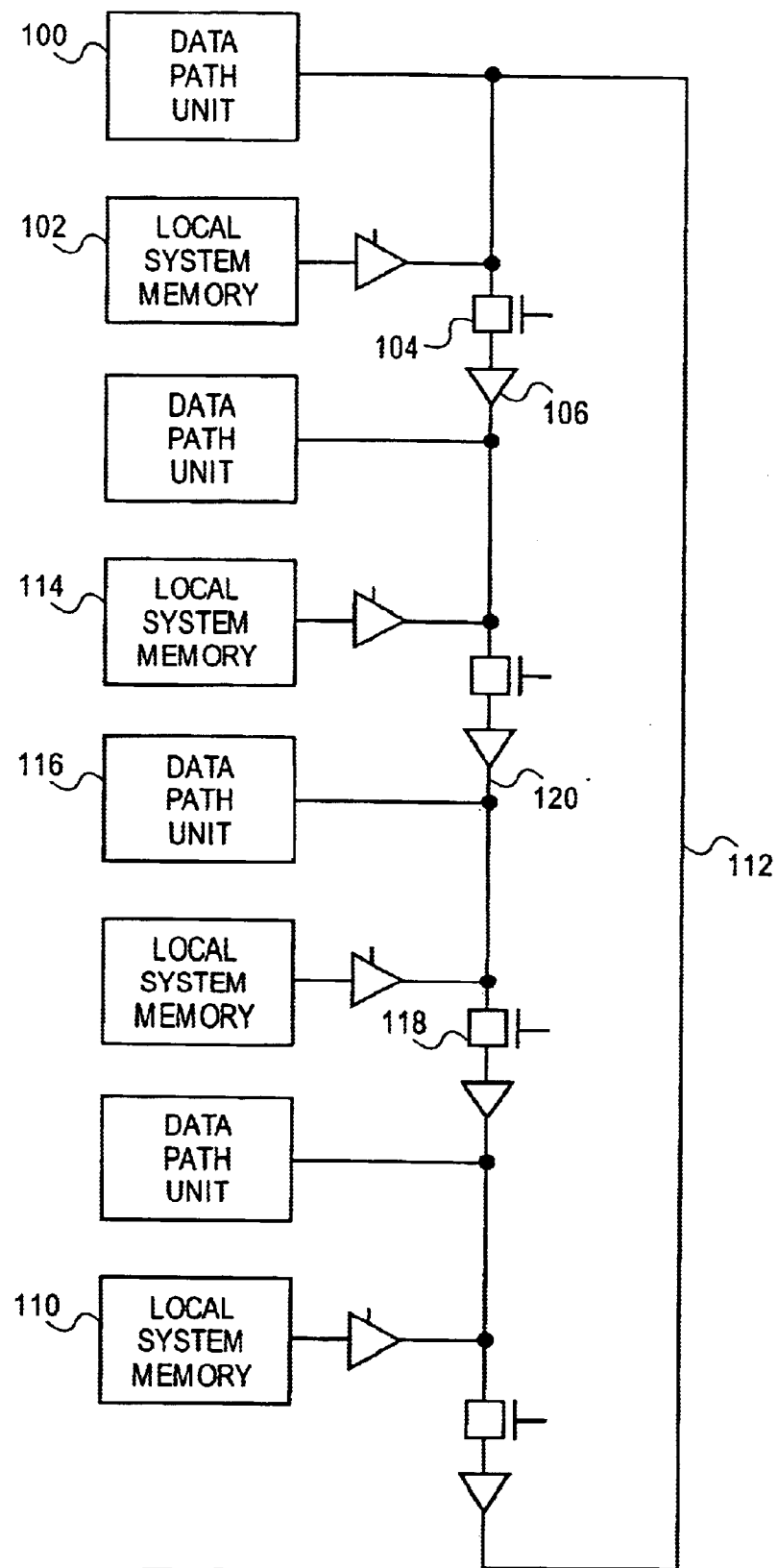
FIG. 4 is a diagram that illustrates one embodiment of the present invention using buffer elements and a loop interconnection path.
Figure 5:
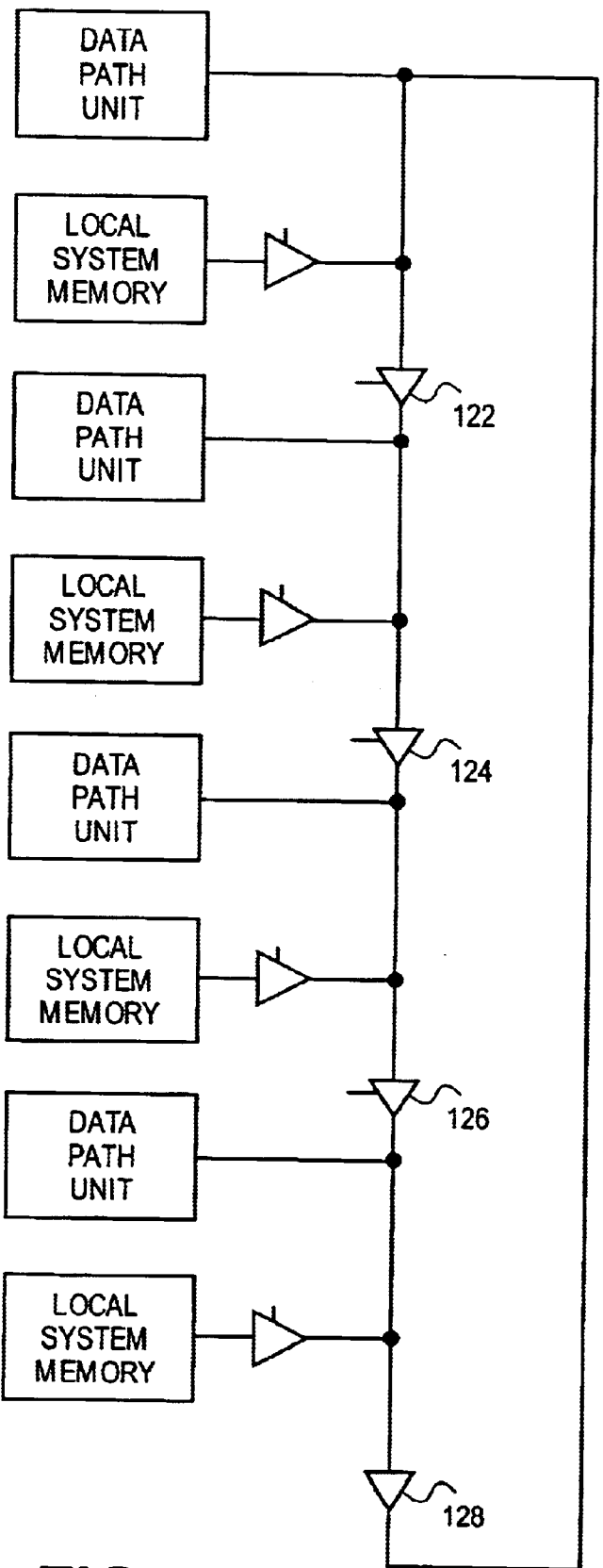
FIG. 5 is a diagram that illustrates an embodiment using tri-state elements and a loop interconnection path.

FIG. 4 illustrates an embodiment which uses an interconnect path arranged in a loop. The elements such as the data path unit 100 and local system memory 102 are interconnected using an isolating element such as element 104 and a buffer element such as buffer 106. In one embodiment, the buffer elements can be inverters. The use of the buffers such as buffer 106 reduces signal rise and fall times since the buffer charges the parasitic capacitance in the interconnect line. The down side of using buffers is that the line becomes unidirectional. The system of FIG. 4 uses an interconnect loop in which, for example, data from local system memory 110 can be sent to the data path unit 100 through a return loop segment 112. Note that the isolating elements 104 produce a number of path segments for the loop. Thus, data could be sent from local system memory 114 to data path unit 116 as long as the isolating elements 104 and 118 isolate the segments 112 and 120.

Figure 6:
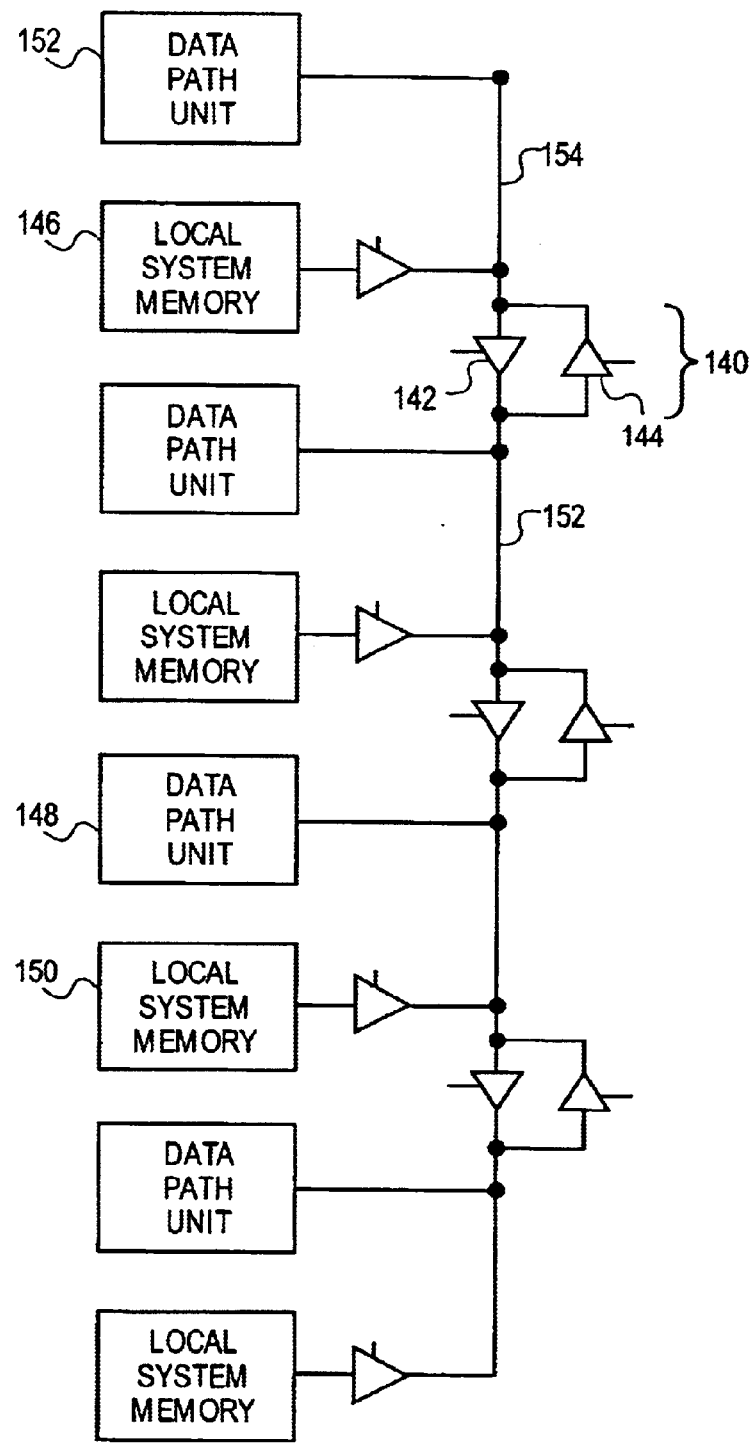
FIG. 6 is a diagram that illustrates an embodiment using a bidirectional interconnect system.

FIG. 6 illustrates an embodiment in which bidirectional connections are made using two different tri-state buffers. The tri-state buffer portion 140 includes tri-state buffer 142 and tri-state buffer 144. This allows data to be sent in either direction. That is, data can be sent going from local system memory 146 to data path unit 148 or from local system memory 150 to data unit 152. When data is sent from local system memory 146 to data path unit 148, gated transistor 142 will be on but gated transistor 144 will be off. When data is going from local system memory 150 to data path unit 152, tri-state buffer 144 will be on but tri-state buffer 142 will be off. When the path segments 152 and 154 are isolated, both the tri-state buffers 142 and 144 are turned off.

The bidirectional system of FIG. 6 allows different segments along a path to be interconnected in either direction without requiring a loop return path. Note that the tri-state buffers 142 and 144 of FIG. 6 can be replaced by a pass gate and buffer combination.

Other modifications and implementations are within the spirit and scope of the present invention as claimed. Accordingly, the above description is not intended to limit the invention, which is to be limited only by the following claims.

What is claimed is:

1. A reconfigurable chip comprising:
   a plurality of reconfigurable elements arranged in a line;
   interconnection units arranged in a first path to allow the plurality of elements to be interconnected to one another; and
   a second bypass path including at least one additional interconnection unit, the second bypass path allowing the interconnection of at least some of the elements while bypassing a number of the interconnection units in the first path so as to reduce the signal delay between the at least some of the elements.

2. The reconfigurable chip of claim 1 wherein the interconnection units are pass gate units.

3. The reconfigurable chip of claim 1 wherein the first path and second bypass path are buses that allow the transfer of multiple bits of data.

4. The reconfigurable chip of claim 1, wherein each reconfigurable element comprises a data path unit and local system memory pair.

5. The reconfigurable chip of claim 1, further comprising multiple bypass paths including additional interconnection units, the additional bypass paths being arranged to bypass a number of the interconnection units in the first path.

6. The reconfigurable chip of claim 1, wherein the elements include both a data path unit and a local system memory.

7. A reconfigurable chip comprising:
   a plurality of reconfigurable elements arranged in a line; and
   an interconnection path arranged in a loop to allow the plurality of elements to be interconnected to one another, the interconnection path including buffer elements to reduce the signal delay and isolating elements to electrically isolate different segments of the loop.

8. The reconfigurable chip of claim 7 wherein the buffer element comprises a buffer.

9. The reconfigurable chip of claim 7 wherein the buffer element comprises an inverter.

10. The reconfigurable chip of claim 7 wherein the isolating element comprises a pass transistor.

11. The reconfigurable chip of claim 7 wherein the buffer element and isolating element comprise a tri-state buffer.

12. The reconfigurable chip of claim 7 wherein the buffer elements and isolating elements are arranged so that data can be transferred bidirectionally.

13. The reconfigurable chip of claim 7, wherein each reconfigurable element comprises a data path unit and local system memory pair.

14. A reconfigurable chip comprising:
   a plurality of reconfigurable elements arranged in a line; and
   an interconnection path to allow the plurality of elements to be interconnected to one another, the interconnection path including buffer elements to reduce the signal delay and isolating elements to electrically isolate different segments of the interconnect path, the buffer and isolating elements arranged such that signals can go in either direction along the segments.

15. The reconfigurable chip of claim 14 wherein the plurality of reconfigurable elements arranged in a line comprises at least some nonadjacent elements; the interconnection paths in further comprising a loop to interconnect the at least some nonadjacent elements.

16. The reconfigurable chip of claim 14 wherein the buffer elements comprise a buffer.

17. The reconfigurable chip of claim 14 wherein the buffer elements comprise an inverter.

18. The reconfigurable chip of claim 14 wherein the isolating elements comprise pass transistors.

19. The reconfigurable chip of claim 14 wherein the buffer elements and isolating elements comprise tri-state buffers.

20. The reconfigurable chip of claim 14, wherein each reconfigurable element comprises a data path unit and local system memory pair.

21. A method for data transfer on a reconfigurable chip including a plurality of reconfigurable elements arranged in a line and a plurality of selectable interconnect units for interconnecting the plurality of reconfigurable elements, said method comprising the steps of:
   selecting at least some interconnect units in a first path to allow the plurality of reconfigurable elements to be interconnected with one another;
   selecting at least one additional interconnect unit in a second bypass path allowing the interconnection of at least some of the reconfigurable elements while bypassing a number of the interconnect units in the first path so as to reduce the signal delay between the at least some of the reconfigurable elements;
   transferring data among the plurality of reconfigurable elements on the first path; and
   transferring data among the at least some of the reconfigurable elements on the second bypass path.

22. The method for data transfer on a reconfigurable chip of claim 21 wherein the interconnection units are pass gate units.

23. The method for data transfer on a reconfigurable chip of claim 21 wherein the first path and second bypass path are buses that allow the transfer of multiple bits of data.

24. The method for data transfer on a reconfigurable chip of claim 21 further comprising the steps of:
   selecting multiple bypass paths including additional interconnection units, the additional bypass paths being arranged to bypass a number of the interconnection units in the first path; and
   transferring data among the at least some of the reconfigurable elements on the multiple bypass paths.

25. The method for data transfer on a reconfigurable chip of claim 21 wherein the elements include both a data path unit and a local system memory.

26. The method for data transfer on a reconfigurable chip of claim 21 wherein each reconfigurable element comprises a data path unit and local system memory pair.

27. A method for data transfer on a reconfigurable chip including a plurality of reconfigurable elements arranged in a line and an interconnection path arranged in a loop including a plurality of buffer elements to reduce the signal delay and a plurality of isolating elements to electrically isolate segments of the loop, said method comprising the steps of:

isolating at least some segments of the loop;

buffering data on the at least some segments of the loop with at least some buffering elements to reduce the signal delay on the at least some segments of the loop; and transferring data among at least some of the reconfigurable elements on the at least some segments of the loop.

28. The method of data transfer on a reconfigurable chip of claim 27 wherein the buffer elements comprise a buffer.

29. The method of data transfer on a reconfigurable chip of claim 27 wherein the buffer elements comprise an inverter.

30. The method of data transfer on a reconfigurable chip of claim 27 wherein the buffer elements comprise a pass transistor.

31. The method of data transfer on a reconfigurable chip of claim 27 wherein the buffer elements and isolating elements comprise a tri-state buffer.

32. The method of data transfer on a reconfigurable chip of claim 27 wherein the buffer elements and isolating elements are arranged so that data can be transferred bidirectionally.

33. The method of data transfer on a reconfigurable chip of claim 27 wherein each reconfigurable element comprises a data path unit and local system memory pair.

34. A method for data transfer on a reconfigurable chip including a plurality of reconfigurable elements arranged in a line, an interconnection path including buffer elements to reduce the signal delay and isolating elements to electrically isolate different segments of the interconnect path, the buffer and isolating elements arranged such that signals can go in either direction along the segments, said method comprising the steps of:

isolating at least some segments of the interconnection path;

buffering data on the at least some segments of the interconnection path with at least some buffering elements to reduce the signal delay on the at least some segments of the interconnection path; and transfering data bidirectionally among at least some of the reconfigurable elements on the at least some segments of the interconnection path.

35. The method for data transfer on a reconfigurable chip of claim 34 wherein the plurality of reconfigurable elements comprises at least some nonadjacent elements, the interconnection path further comprising a path to interconnect the at least some of the nonadjacent elements.

36. The method for data transfer on a reconfigurable chip of claim 34 wherein the buffer elements comprise a buffer.

37. The method for data transfer on a reconfigurable chip of claim 34 wherein the buffer elements comprise an inverter.

38. The method for data transfer on a reconfigurable chip of claim 34 wherein the isolating elements comprise pass transistors.

39. The method for data transfer on a reconfigurable chip of claim 34 wherein the buffer elements and isolating elements comprise tri-state buffers.

40. The method for data transfer on a reconfigurable chip of claim 34 wherein each reconfigurable element comprises a data path unit and local system memory pair.

\* \* \* \* \*

UNITED STATES PATENT AND TRADEMARK OFFICE
CERTIFICATE OF CORRECTION

PATENT NO. : 6,657,457 B1 Page 1 of 1
DATED : December 2, 2003
INVENTOR(S) : Hanrahan et al.

It is certified that error appears in the above-identified patent and that said Letters Patent is hereby corrected as shown below:

Column 4,
Line 22, delete "paths in" and insert -- path --.

Signed and Sealed this

Twenty-second Day of June, 2004

JON W. DUDAS
*Acting Director of the United States Patent and Trademark Office*